United States Patent
Michel

(10) Patent No.: US 11,349,439 B2
(45) Date of Patent: May 31, 2022

(54) METHOD FOR AMPLIFIER LOAD CURRENT CANCELLATION IN A CURRENT INTEGRATOR AND CURRENT INTEGRATOR WITH AMPLIFIER LOAD CURRENT CANCELLATION

(71) Applicant: ams International AG, Jona (CH)

(72) Inventor: Fridolin Michel, Eindhoven (NL)

(73) Assignee: AMS INTERNATIONAL AG, Jona (CH)

(*) Notice: Subject to any disclaimer, the term of this patent is extended or adjusted under 35 U.S.C. 154(b) by 37 days.

(21) Appl. No.: 17/041,213

(22) PCT Filed: Apr. 23, 2019

(86) PCT No.: PCT/EP2019/060327
§ 371 (c)(1),
(2) Date: Sep. 24, 2020

(87) PCT Pub. No.: WO2019/206881
PCT Pub. Date: Oct. 31, 2019

(65) Prior Publication Data
US 2021/0218372 A1  Jul. 15, 2021

(30) Foreign Application Priority Data
Apr. 24, 2018 (EP) .................................... 18169005

(51) Int. Cl.
*H03F 1/26* (2006.01)
*H03M 1/40* (2006.01)
*H03M 3/00* (2006.01)

(52) U.S. Cl.
CPC .............. *H03F 1/26* (2013.01); *H03M 1/403* (2013.01); *H03M 3/464* (2013.01);
(Continued)

(58) Field of Classification Search
CPC ................. H03F 1/26; H03F 2200/264; H03F 2200/462; H03F 2200/481; H03F 3/187;
(Continued)

(56) References Cited

U.S. PATENT DOCUMENTS 9,351,352 B2 * 5/2016 Szolusha .............. H05B 45/325
2015/0123828 A1 * 5/2015 Alldred ................. H03M 3/442
341/143

(Continued)

FOREIGN PATENT DOCUMENTS

WO    2010/119456    10/2010
WO    2015/107091    7/2015

OTHER PUBLICATIONS

European Patent Office, International Search Report for PCT/EP2019/060327 dated Jul. 11, 2019.
(Continued)

*Primary Examiner* — Ryan Jager
(74) *Attorney, Agent, or Firm* — MH2 Technology Law Group LLP

(57) ABSTRACT

The amplifier load current cancellation in a current integrator comprises applying an input current to an operational transconductance amplifier provided with an integration capacitor for current integration, leading an output current of the operational transconductance amplifier through a sensing resistor, thus producing a voltage drop over the sensing resistor, generating a cancellation current dependent on the voltage drop over the sensing resistor, and injecting the cancellation current to the output current, before or after the output current passes the sensing resistor, thus eliminating a dependence of the output current on the input current.

15 Claims, 6 Drawing Sheets

(52) U.S. Cl.
CPC .. *H03F 2200/264* (2013.01); *H03F 2200/462* (2013.01); *H03F 2200/481* (2013.01)

(58) Field of Classification Search
CPC ..... H03F 1/3205; H03M 1/403; H03M 3/464; H03M 1/141; H03M 1/144; H03M 3/358
USPC ......................................................... 327/337
See application file for complete search history.

(56) References Cited

U.S. PATENT DOCUMENTS

2021/0218372 A1* 7/2021 Michel .................... H03F 3/187
2021/0336445 A1* 10/2021 Oner ....................... H03F 3/347

OTHER PUBLICATIONS

Jain, A. et al.: "Design and Analysis of a High Speed Continuous Time Delta Sigma Modulator using the Assisted Opamp Technique" IEEE Journal of Solid State Circuits, Jul. 2012.
Kim, J.-H.: "A 14 b extended counting ADC implemented in a 24 MPixel APS-C CMOS image sensor" IEEE ISSCC Dig. Tech. Papers, pp. 390-392, 2012.
Maeyer, J. D. et al.: "A double-sampling extended-counting ADC" IEEE J. Solid-State Circuits, vol. 39, No. 3, pp. 411-418, Mar. 2004.
Pavan, S. et al.: "Power reduction in continuous-time Delta-Sigma modulators using the assisted opamp technique" IEEE Journal of Solid State Circuits, Jul. 2010.
Thyagarajan, S. V. et al.: "Active-RC Filters Using the Gm-Assisted OTA-RC Technique" IEEE Journal of Solid-State Circuits, vol. 46, No. 7, Jul. 2011, pp. 1522-1533.

* cited by examiner

METHOD FOR AMPLIFIER LOAD CURRENT CANCELLATION IN A CURRENT INTEGRATOR AND CURRENT INTEGRATOR WITH AMPLIFIER LOAD CURRENT CANCELLATION

The present invention relates to the field of current integrators with switched-capacitor digital-to-analog converter.

BACKGROUND OF THE INVENTION

The circuit diagram shown in FIG. 6 depicts a basic circuit topology of a typical integration stage used in a digital-to-analog converter (DAC). Current is integrated on an integration capacitor $C_{int}$ by enforcing a virtual ground potential $v_n$ on the input current $I_{in}$. The virtual ground potential $v_n$ is the quotient of the output current $I_{out}$ and the transconductance $g_m$: $v_n = I_{out}/g_m$.

As the increasing current on the integration capacitor $C_{int}$ results in an increasing output voltage $V_{out}$, the circuit is almost always used in feedback, such as in delta-sigma converters. Feedback can be generated by a current source or a switched-capacitor digital-to-analog converter (SC DAC), which injects current into the node of the virtual ground potential to subtract charge from the integration capacitor, thus keeping the output voltage $V_{out}$ in the allowed range.

In a switched-capacitor digital-to-analog converter, charge packages of size $Q=C(V_{DAC}-v_n)$ are injected, where C is the capacitance of the integration capacitor $C_{int}$ and $V_{DAC}$ is a supply voltage of the digital-to-analog converter. Hence the virtual ground potential $v_n$ directly affects the DAC charge.

As the capacitance of the load capacitor $C_L$ can be considered linear, the output current $I_{out}$ is also linearly related to the input current $I_{in}$, thereby making the virtual ground potential $v_n$ depend on the input signal. This signal dependency causes nonlinearity which is inacceptable in high accuracy applications.

To tackle this problem, the transconductance $g_m$ may be increased in order to reduce the virtual ground potential $v_n$, but this comes at the expense of higher power consumption. Alternatively, digital calibration can be employed, but this method requires estimation of a calibration constant for each device, which may be difficult to achieve with sufficient accuracy to comply with very high linearity requirements.

A more practical solution is to minimize the output load current of the operational transconductance amplifier (OTA). Such a technique has been proposed for voltage input delta-sigma converters wherein virtual ground spikes during feedback are minimized by injecting the DAC signal and the estimated input signal charge at the output. The effective input current is estimated by a feed-forward transconductor $g_{mff}$ as in the circuit shown in FIG. 7. However, the feed-forward transconductance $g_{mff}$ will not match the resistor R accurately over process, temperature and input signal variations, and the elimination of deviations of the virtual ground potential $v_n$ may not be sufficiently precise for high-linearity applications.

Known solutions focus at reducing the dynamic deviations $\Delta v_{n,\,dyn}$ of the virtual ground potential $v_n$ at the beginning of the DAC pulse in voltage input integration stages (FIG. 8). But for a highly linear SC DAC, the static deviation $\Delta v_{n,\,stat}$ of the virtual ground potential $v_n$ at the end of the DAC pulse is important, because it determines the accuracy of the charge transfer. The virtual ground potential $v_n$ should be equal to the ground potential at the end of the DAC pulse.

Furthermore, the known solutions assume that the major output current of the operational transconductance amplifier flows into the integration capacitor $C_{int}$. If the capacitance of the load capacitor $C_L$ is a multiple of the capacitance of the integration capacitor $C_{int}$, the load current of the operational transconductance amplifier is accordingly higher. In particular if different types of capacitors $C_L$ and $C_{int}$ are employed, process tolerances and temperature variations may render the minimization of the load current inefficient.

SUMMARY OF THE INVENTION

The definitions as described above also apply to the following description unless stated otherwise.

The method for amplifier load current cancellation in a current integrator comprises applying an input current to an operational transconductance amplifier provided with an integration capacitor for current integration, leading an output current of the operational transconductance amplifier through a sensing resistor, thus producing a voltage drop over the sensing resistor, generating a cancellation current dependent on the voltage drop over the sensing resistor, and injecting the cancellation current to the output current, before or after the output current passes the sensing resistor, thus eliminating a dependence of the output current on the input current.

In a variant of the method, the voltage drop over the sensing resistor is integrated, and the integrated voltage drop is converted into the cancellation current. A switched capacitor integrator may be provided to integrate the voltage drop. The cancellation current may particularly be injected to the output current after the output current passes the sensing resistor.

In a further variant of the method, the voltage drop over the sensing resistor is sampled on a capacitor, and the sampled voltage drop is converted into the cancellation current. This conversion may especially be effected by a further operational transconductance amplifier. The cancellation current may particularly be injected to the output current before the output current passes the sensing resistor.

The current integrator comprises an operational transconductance amplifier provided with an integration capacitor for current integration, a sensing resistor connected to an output of the operational transconductance amplifier, a conversion circuit configured for converting a voltage drop over the sensing resistor to a cancellation current, and a connection between an output of the conversion circuit and a node located immediately before or immediately after the sensing resistor.

In an embodiment of the current integrator, the conversion circuit comprises a further integrator configured to integrate the voltage drop over the sensing resistor. The further integrator may especially be a switched capacitor integrator.

A further embodiment of the current integrator comprises a further operational transconductance amplifier of the conversion circuit. The further operational transconductance amplifier is configured to convert an output of the further integrator into the cancellation current.

In a further embodiment of the current integrator, the sensing resistor is arranged between the operational transconductance amplifier and an output node, and an output of the further operational transconductance amplifier is connected to the output node.

In a further embodiment of the current integrator, the conversion circuit is configured to sample the voltage drop over the sensing resistor on a capacitor. In particular, a further operational transconductance amplifier may be employed to convert the sampled voltage drop into the cancellation current. An output of the further operational transconductance amplifier may especially be connected to a node between the operational transconductance amplifier and the sensing resistor.

The following is a detailed description of examples of the method and the current integrator in conjunction with the appended figures.

DETAILED DESCRIPTION

Figure 1:
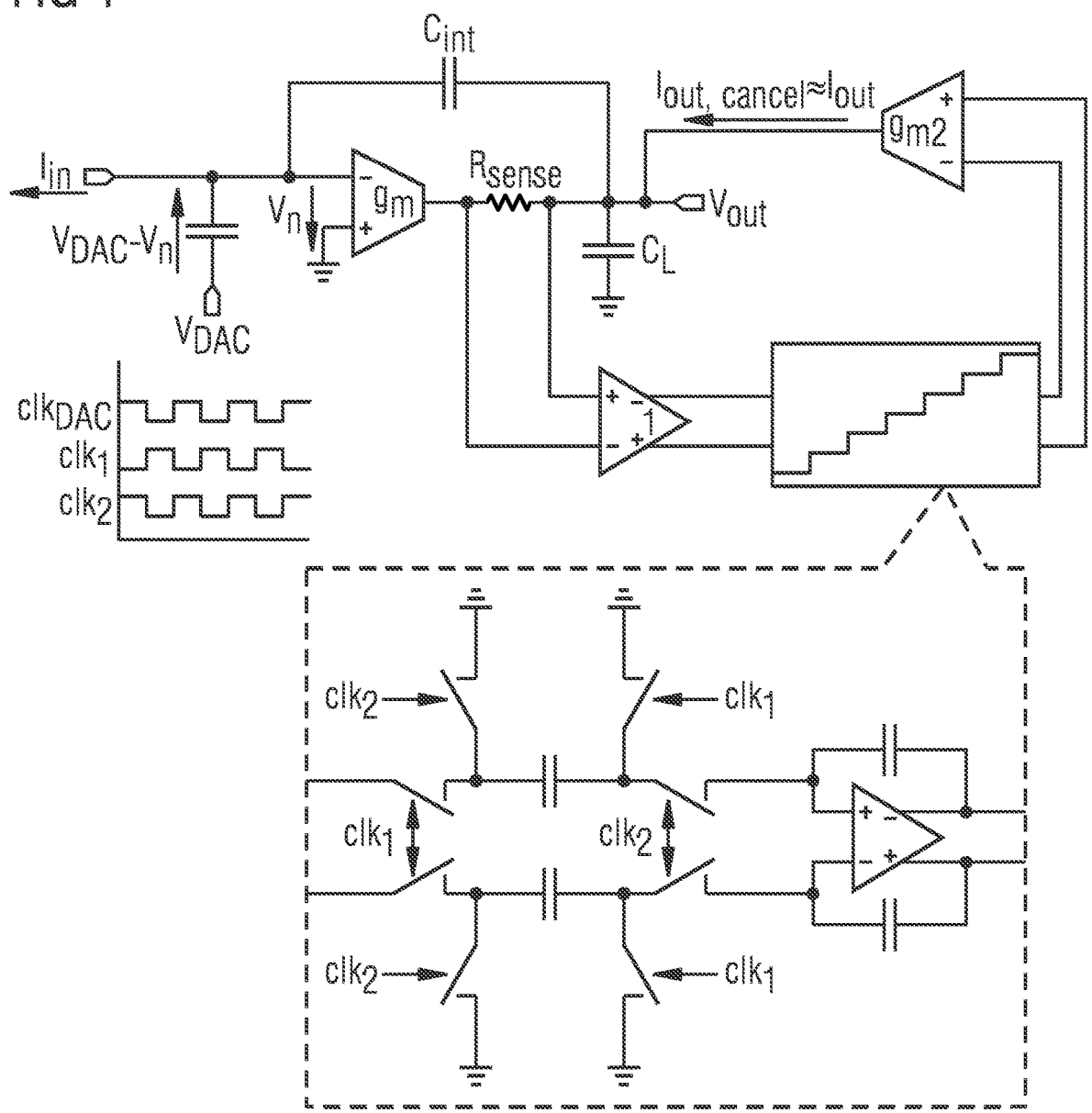
FIG. 1 shows diagrams illustrating a load current cancellation method.

FIG. 1 shows diagrams illustrating a load current cancellation method. The operational transconductance amplifier has a transconductance $g_m$. An integration capacitor $C_{int}$ is provided for current integration. A sensing resistor $R_{sense}$ is provided to sense the output current $I_{out}$ in order to obtain a linear estimate of the output current $I_{out}$. The sensing resistor $R_{sense}$ is sized for a voltage drop of a fraction of the available output swing of the operational transconductance amplifier in order not do degrade the performance of the operational transconductance amplifier. The voltage drop over the sensing resistor $R_{sense}$ is buffered and integrated, in particular with a switched capacitor integrator, for instance.

The integrator output is converted into a current which is injected at the output via a further operational transconductance amplifier, which has a transconductance $g_{m2}$. In turn the output current of the operational transconductance amplifier will decrease, which reduces the voltage drop over the sensing resistor $R_{sense}$. Thus a feedback loop is formed, which drives the voltage drop over the sensing resistor $R_{sense}$ (i. e., the load current of the operational transconductance amplifier) to zero. This feedback loop is nested in the feedback loop of the operational transconductance amplifier and requires low loop gain to guarantee stability.

Figure 2:
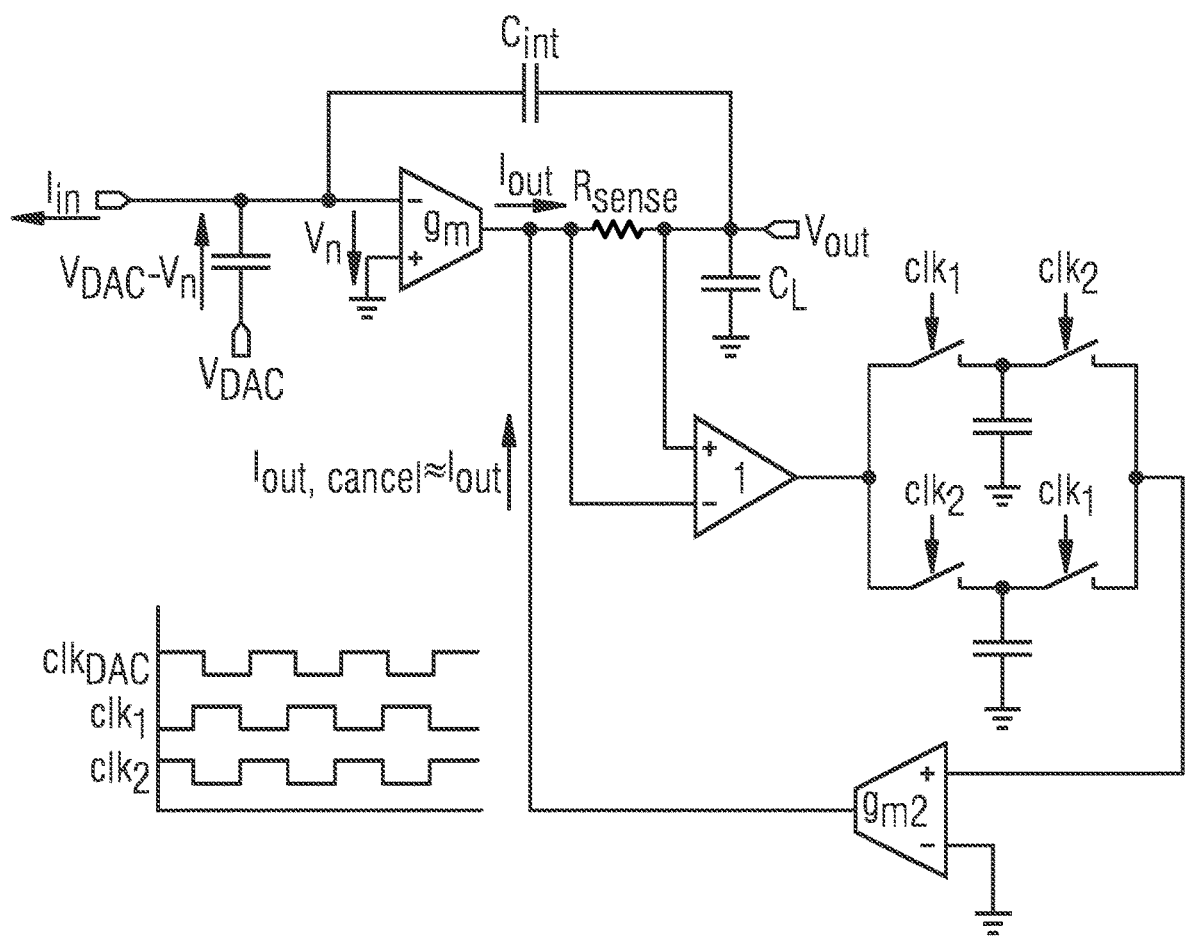
FIG. 2 shows diagrams illustrating a further load current cancellation method.

FIG. 2 shows diagrams illustrating a further load current cancellation method, which does not use feedback. The voltage drop over the sensing resistor $R_{sense}$ is buffered and sampled, in particular on a capacitor, for instance. For this purpose two separate capacitors may be provided, which are alternatingly switched by a first clock signal $clk_1$ and a second clock signal $clk_2$ synchronized with the DAC clock signal $clk_{DAC}$, as shown in FIG. 2. The sampled voltage is converted to a cancellation current $I_{out, cancel}$, which cancels the load current at the output of the operational transconductance amplifier.

In the circuit according to FIG. 2, there is no feedback loop to pose stability and settling requirements, because the operational transconductance amplifier will always adjust its output current $I_{out}$ to match the required load current $I_{load}$ in combination with the injected cancellation current $I_{out, cancel}$: $I_{out} = I_{out, cancel} + I_{load}$ Hence the voltage drop over the sensing resistor $R_{sense}$ is constant and independent of the cancellation current $I_{out, cancel}$. The cancellation current $I_{out, cancel}$ is injected based on the measured output current $I_{out}$ from the previous clock cycle. This cancellation scheme is therefore efficient as long as the time constant of the input signal is larger than the period of the DAC clock signal $clk_{DAC}$. This is typically the case in oversampled delta-sigma converters. This assumption is valid especially when low-frequency linearity is a concern.

Figure 3:
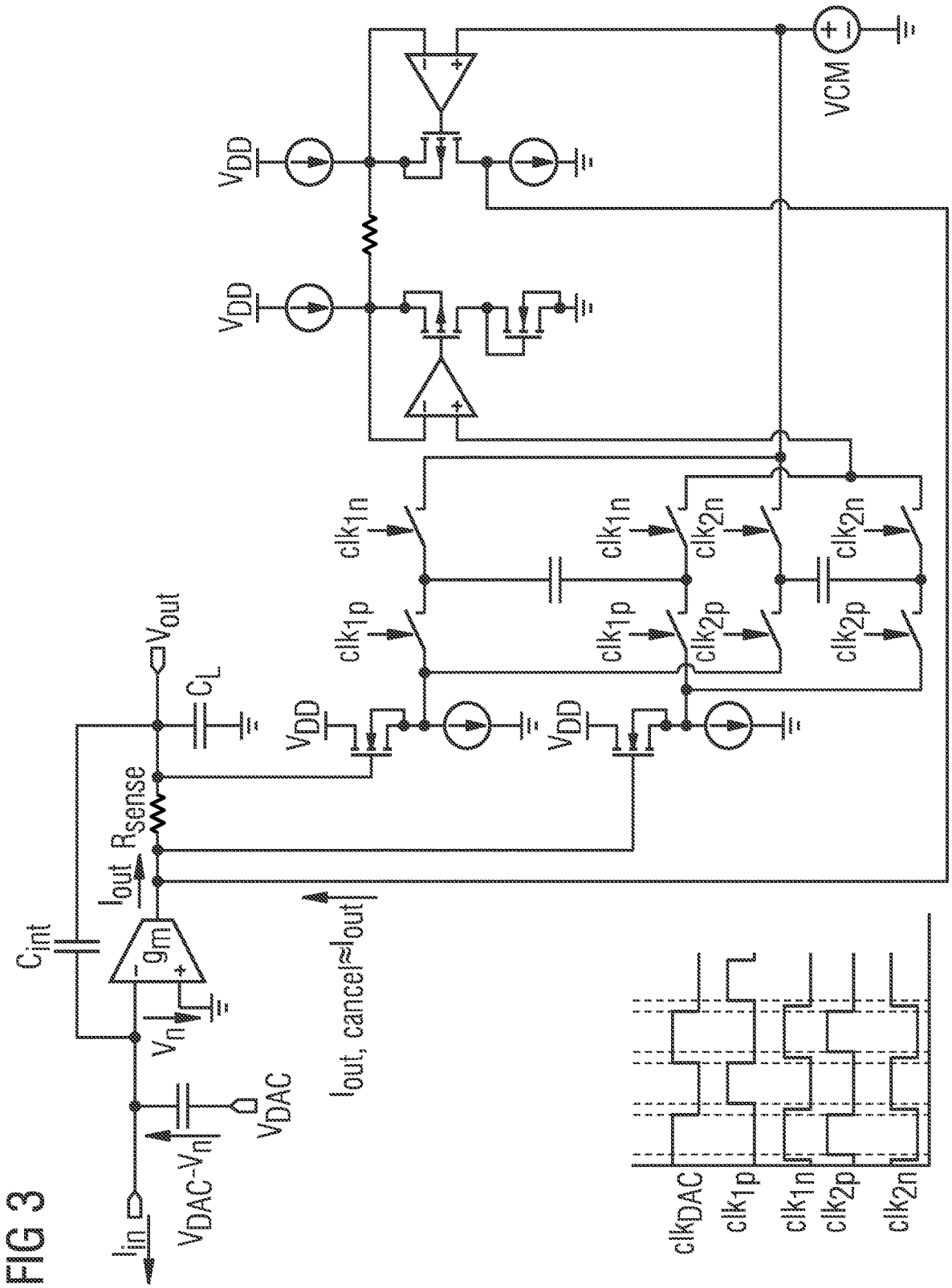
FIG. 3 shows a circuit diagram for an implementation of the further load current cancellation method.

An example of a detailed circuit implementation of the further load current cancellation method is depicted in FIG. 3. The voltage at the sensing resistor $R_{sense}$ may be differentially sampled to eliminate systematic charge injection errors. A connection of both capacitors during switch transitions can be avoided by a non-overlapping sample clock. Moreover, switching according to the first clock signal $clk_1$ and the second clock signal $clk_2$ is performed after the DAC settling finishes. A linear transconductor is employed to convert the sampled voltage at the sensing resistor $R_{sense}$ to the cancellation current $I_{out, cancel} = I_{out} \cdot Q_R$, where $Q_R$ is the quotient of the electrical resistances of the sensing resistor $R_{sense}$ and the resistor R.

The achieved cancellation is essentially insensitive to process tolerances and temperature variations, since it only depends on the quotient $Q_R$, and an exact cancellation by an accurate match of the electrical resistances of the sensing resistor $R_{sense}$ and the resistor R is comparatively easily obtained. The linear transconductor employs local feedback to achieve linearity and thus is subjected to the same settling constraint as the main integrator itself.

However, owing to the absence of a large load capacitance in the local feedback loop, the settling requirement can be achieved at much lower power consumption than for the main integrator. Besides, noise from the buffer and transconductor is injected at the integrator output so that it is highly suppressed by the OTA open loop gain. Hence, the power and noise penalty of the load current cancellation scheme is low.

Figure 4:
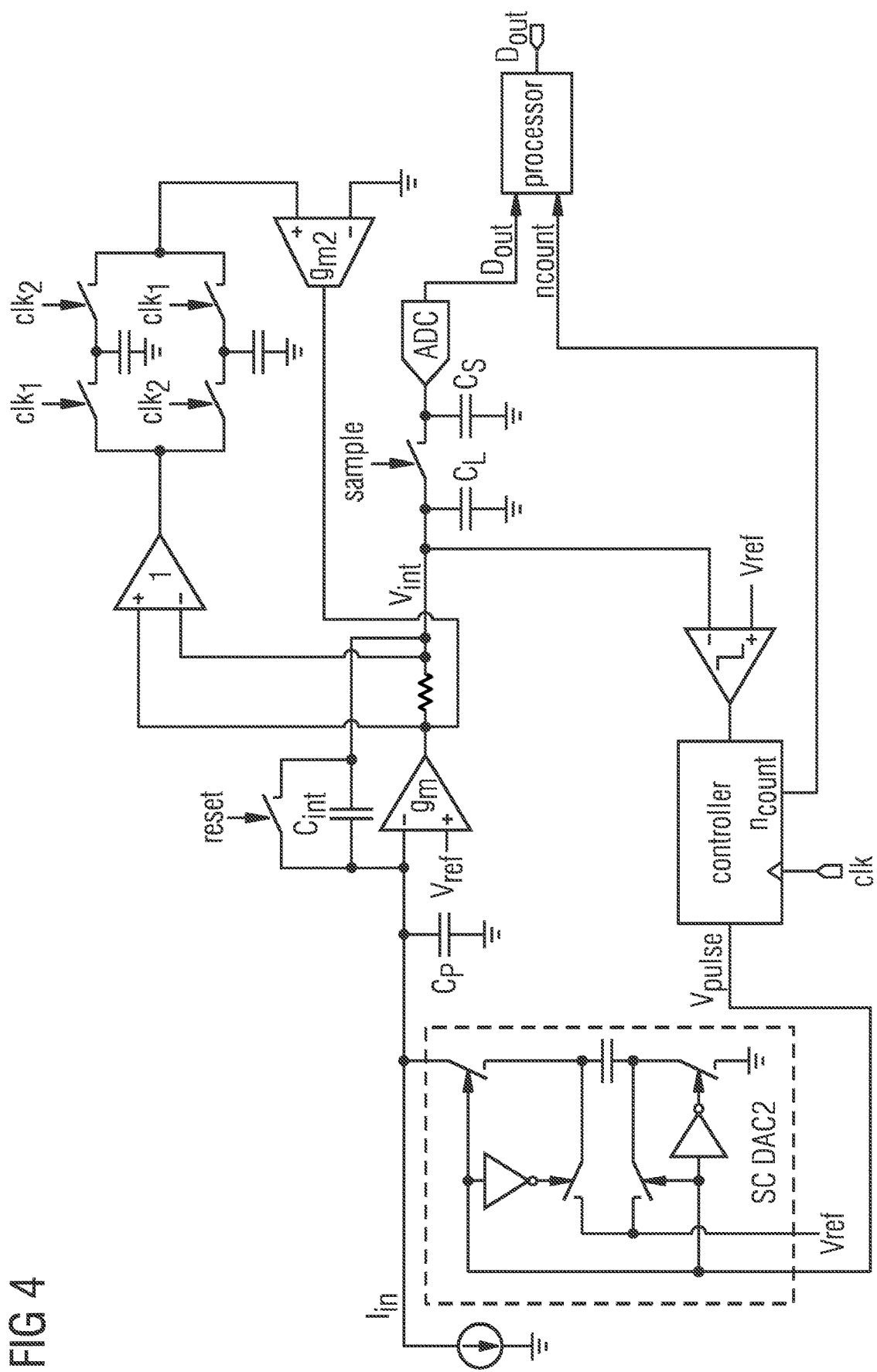
FIG. 4 shows a circuit diagram of a current domain incremental two-step analog-to-digital converter using the load current cancellation circuit.

FIG. 4 shows a circuit diagram of a current domain incremental two-step analog-to-digital converter. In this circuit the residue of the first analog-to-digital converter is converted by a second stage analog-to-digital converter. The first stage is implemented as current controlled oscillator (CCO). The integrator output is compared to a reference voltage $V_{ref}$, and the comparator output is synchronized to the clock signal clk. The synchronized comparator output triggers the DAC feedback pulses. DAC feedback is realized by a precharged capacitor that is discharged into the virtual ground node (SC DAC). The total number of feedback pulses $n_{count}$ during one full integration period $T_{int}$ provides the course analog-to-digital conversion value.

The first stage can work as stand-alone or be combined with a fine conversion result by digitization of the output residue $V_{residue}$ of the CCO in order to increase resolution. As the two-stage concept requires a large sampling capacitor that might not correlate to the integration capacitor $C_{int}$ in terms of process, voltage and temperature variation (PVT), using the output cancellation technique described above is particularly powerful because it is inherently PVT robust.

Figure 5:
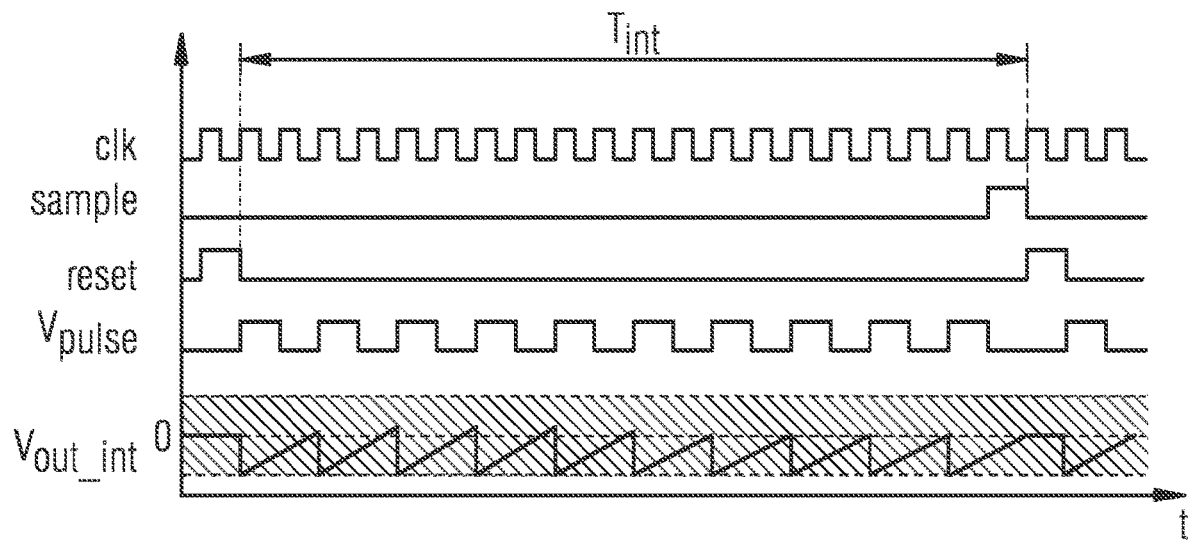
FIG. 5 is a timing diagram for the circuit of FIG. 4.
Figure 6:
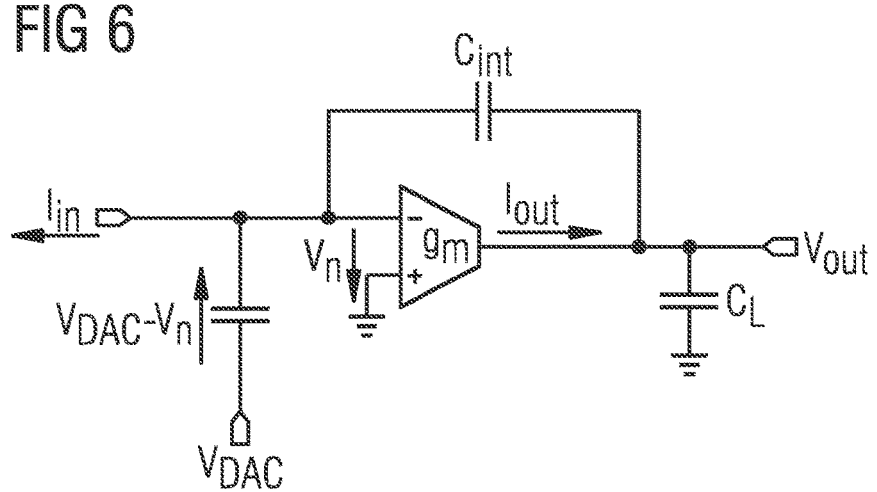
FIG. 6 shows a circuit diagram of a basic integration stage used in delta-sigma converters.
Figure 7:
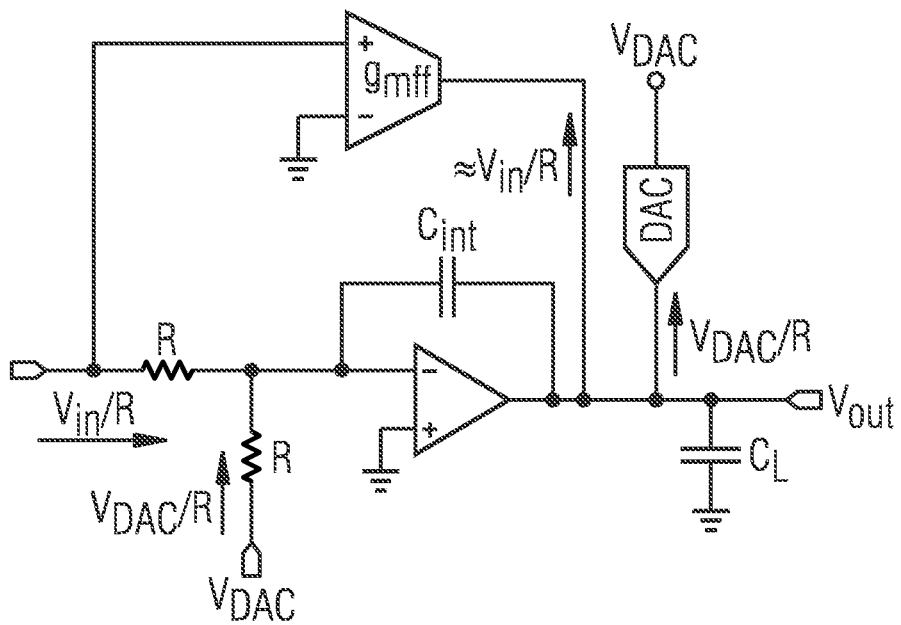
FIG. 7 shows a circuit diagram of an assisted operational amplifier technique.
Figure 8:
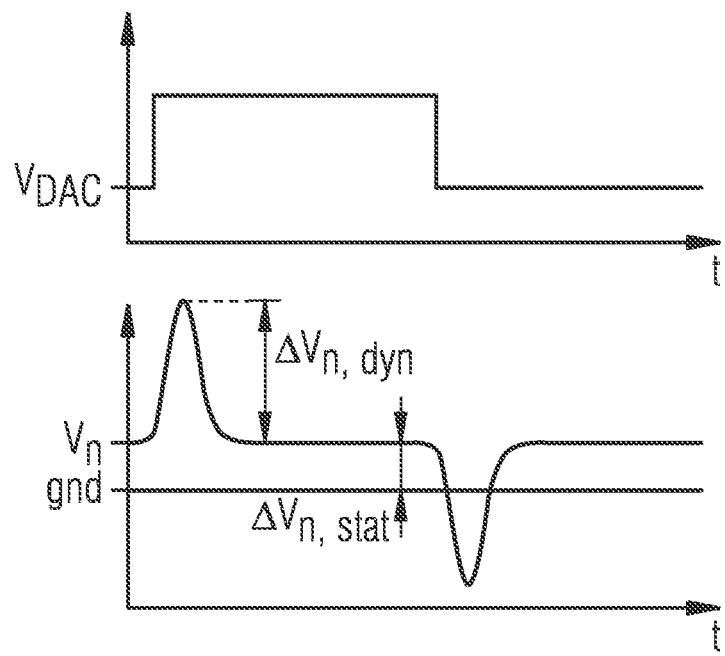
FIG. 8 shows the supply voltage $V_{DAC}$ and the deviations of the virtual ground potential $v_n$ from the ground potential gnd as functions of time t.

FIG. 5 is a timing diagram for the circuit of FIG. 4. FIG. 5 shows the clk signal clk, the sample and reset signal pulses, the pulsed voltage $V_{pulse}$, and the integrated output voltage $V_{out\_int}$ as functions of the time t.

An offset in the buffer and linear transconductor translate to increased offset at the OTA input. This does not affect linearity but gives rise to a constant DAC offset error. This is not a drawback, because the operational transconductance amplifier itself exhibits offset, and hence the DAC offset must anyway be calibrated in applications with high gain accuracy requirements.

With the described method the output current is precisely measured and converted into a precise cancellation current. Linearity is thus guaranteed, as opposed to conventional calibration assisted solutions. This method has the advantage that it takes account of the static deviation $\Delta v_{n,\,stat}$ of the virtual ground potential $v_n$ at the end of the DAC pulse. The described method accurately eliminates the static error both for voltage and current domain topologies.

The invention claimed is:

1. A method for amplifier load current cancellation in a current integrator, comprising:
    applying an input current to an operational transconductance amplifier provided with an integration capacitor for current integration,
    leading an output current of the operational transconductance amplifier through a sensing resistor, thus producing a voltage drop over the sensing resistor,
    generating a cancellation current dependent on the voltage drop over the sensing resistor, and
    injecting the cancellation current to the output current, before or after the output current passes the sensing resistor, thus eliminating a dependence of the output current on the input current.

2. The method of claim 1, further comprising:
    integrating the voltage drop over the sensing resistor and converting the integrated voltage drop into the cancellation current.

3. The method of claim 2, wherein the cancellation current is injected to the output current after the output current passes the sensing resistor.

4. The method of claim 2 further comprising:
    providing a switched capacitor integrator, and
    integrating the voltage drop by the switched capacitor integrator.

5. The method of claim 1, wherein the voltage drop over the sensing resistor is sampled on a capacitor, and the sampled voltage drop is converted into the cancellation current.

6. The method of claim 5, wherein the sampled voltage drop is converted into the cancellation current by a further operational transconductance amplifier.

7. The method of claim 5, wherein the cancellation current is injected to the output current before the output current passes the sensing resistor.

8. A current integrator, comprising:
    an operational transconductance amplifier provided with an integration capacitor for current integration,
    a sensing resistor connected to an output of the operational transconductance amplifier,
    a conversion circuit configured for converting a voltage drop over the sensing resistor to a cancellation current, and
    a connection between an output of the conversion circuit and a node located immediately before or immediately after the sensing resistor.

9. The current integrator of claim 8, wherein the conversion circuit comprises a further integrator configured to integrate the voltage drop over the sensing resistor.

10. The current integrator of claim 9, further comprising:
    a further operational transconductance amplifier of the conversion circuit, the further operational transconductance amplifier being configured to convert an output of the further integrator into the cancellation current.

11. The current integrator of claim 10, wherein the sensing resistor is arranged between the operational transconductance amplifier and an output node, and an output of the further operational transconductance amplifier is connected to the output node.

12. The current integrator of claim 9, wherein the further integrator is a switched capacitor integrator.

13. The current integrator of claim 8, wherein the conversion circuit is configured to sample the voltage drop over the sensing resistor on a capacitor.

14. The current integrator of claim 13, further comprising:
    a further operational transconductance amplifier of the conversion circuit, the further operational transconductance amplifier being configured to convert the sampled voltage drop into the cancellation current.

15. The current integrator of claim 14, wherein an output of the further operational transconductance amplifier is connected to a node between the operational transconductance amplifier and the sensing resistor.

* * * * *